United States Patent
Imanaka et al.

(10) Patent No.: US 11,150,092 B2
(45) Date of Patent: Oct. 19, 2021

(54) SENSOR

(71) Applicant: Panasonic Intellectual Property Management Co., Ltd., Osaka (JP)

(72) Inventors: Takashi Imanaka, Osaka (JP); Shoichi Taji, Osaka (JP); Soichiro Hiraoka, Hyogo (JP); Katsuya Morinaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 164 days.

(21) Appl. No.: 16/340,863

(22) PCT Filed: Dec. 19, 2017

(86) PCT No.: PCT/JP2017/045414
§ 371 (c)(1),
(2) Date: Apr. 10, 2019

(87) PCT Pub. No.: WO2018/135211
PCT Pub. Date: Jul. 26, 2018

(65) Prior Publication Data
US 2019/0242709 A1  Aug. 8, 2019

(30) Foreign Application Priority Data

Jan. 17, 2017 (JP) .............................. JP2017-005560
Jan. 17, 2017 (JP) .............................. JP2017-005563

(51) Int. Cl.
*G01C 19/5769* (2012.01)
*G01C 19/5733* (2012.01)
(Continued)

(52) U.S. Cl.
CPC ........ *G01C 19/5769* (2013.01); *B81B 7/0051* (2013.01); *B81B 7/02* (2013.01);
(Continued)

(58) Field of Classification Search
CPC ............ G01C 19/5769; G01C 19/5733; G01C 19/5747
(Continued)

(56) References Cited

U.S. PATENT DOCUMENTS 6,214,243 B1  4/2001  Muenzel et al.
2003/0209075 A1  11/2003  Okada
(Continued)

FOREIGN PATENT DOCUMENTS

JP   6-347475   12/1994
JP   11-513844  11/1999
(Continued)

OTHER PUBLICATIONS

International Search Report of PCT application No. PCT/JP2017/045414 dated Feb. 6, 2018.

*Primary Examiner* — John Fitzgerald
*Assistant Examiner* — Rodney T Frank
(74) *Attorney, Agent, or Firm* — McDermott Will and Emery LLP

(57) ABSTRACT

A sensor includes a sensor substrate, and an upper lid substrate joined to an upper surface of the sensor substrate. The sensor substrate includes a fixed part, a deformable beam connected to the fixed part, and a weight connected to the beam. The weight is movable relative to the fixed part. The upper lid substrate includes a first part containing silicon and a second part joined to the first part and containing glass. The first part includes a projection protruding toward the sensor substrate relative to the second part. The sensor has high accuracy or high reliability.

16 Claims, 19 Drawing Sheets

(51) Int. Cl.
*G01C 19/5747* (2012.01)
*B81B 7/00* (2006.01)
*B81C 1/00* (2006.01)
*B81B 7/02* (2006.01)
*H01L 29/84* (2006.01)

(52) U.S. Cl.
CPC ...... *B81C 1/00325* (2013.01); *G01C 19/5733* (2013.01); *G01C 19/5747* (2013.01); *H01L 29/84* (2013.01); *B81B 2201/0235* (2013.01); *B81B 2201/0242* (2013.01); *B81B 2203/0127* (2013.01); *B81B 2203/0353* (2013.01); *B81C 2201/0105* (2013.01); *B81C 2201/0112* (2013.01); *B81C 2201/0132* (2013.01); *B81C 2203/036* (2013.01)

(58) Field of Classification Search
USPC ........................................ 73/504.15
See application file for complete search history.

(56) References Cited

U.S. PATENT DOCUMENTS

| | | |
|---|---|---|
| 2004/0231422 A1 | 11/2004 | Okada |
| 2009/0137079 A1 | 5/2009 | Kuisma |
| 2014/0319628 A1* | 10/2014 | Nakane ................ G01L 9/0042 257/415 |
| 2016/0003650 A1 | 1/2016 | Kanamaru et al. |

FOREIGN PATENT DOCUMENTS

| | | |
|---|---|---|
| JP | 2008-060382 | 3/2008 |
| JP | 2008-134222 | 6/2008 |
| JP | 4216525 B | 1/2009 |
| JP | 2010-107240 | 5/2010 |
| JP | 2012-156403 | 8/2012 |
| JP | 2013-015529 | 1/2013 |
| JP | 5317154 B | 10/2013 |
| JP | 2014-004676 | 1/2014 |
| JP | 5834098 B | 12/2015 |
| JP | 5953252 B | 7/2016 |

* cited by examiner

SENSOR

CROSS-REFERENCE TO RELATED APPLICATIONS

This application is a U.S. national stage application of the PCT international application No. PCT/JP2017/045414 filed on Dec. 19, 2017, which claims the benefit of foreign priority of Japanese patent application No. 2017-005560 filed on Jan. 17, 2017 and Japanese patent application No. 2017-005563 filed on Jan. 17, 2017, the contents all of which are incorporated herein by reference.

TECHNICAL FIELD

The present invention relates to a sensor for use in, e.g., a control of vehicles.

BACKGROUND ART

PTLs 1 to 5 disclose conventional sensors each including a sensor substrate made of a silicon-on-insulator (SOI) substrate. PTLs 6 and 7 disclose conventional sensors each including an upper lid for sealing a sensor substrate. The upper lid has a structural body made of silicon and glass. There conventional sensors may not sufficiently meet increasing demand for higher accuracy.

CITATION LIST

Patent Literature

PTL 1: Japanese Laid-Open Publication No. 11-513844
PTL 2: Japanese Patent No. 4216525
PTL 3: Japanese Patent No. 5317154
PTL 4: Japanese Patent Laid-Open Publication No. 2010-107240
PTL 5: Japanese Patent No. 5953252
PTL 6: Japanese Patent No. 5834098
PTL 7: Japanese Patent Laid-Open Publication No. 2012-156403

SUMMARY

A sensor includes a sensor substrate, and an upper lid substrate joined to an upper surface of the sensor substrate. The sensor substrate includes a fixed part, a deformable beam connected to the fixed part, and a weight connected to the beam. The weight is movable relative to the fixed part. The upper lid substrate includes a first part containing silicon and a second part joined to the first part and containing glass. The first part includes a projection protruding toward the sensor substrate relative to the second part.

The sensor has high accuracy or high reliability.

BRIEF DESCRIPTION OF DRAWINGS

FIG. 9D is a cross-sectional view of the upper lid substrate of the sensor according to the embodiment for illustrating the method of manufacturing the upper lid substrate of.

DESCRIPTION OF EMBODIMENTS

Figure 1A:
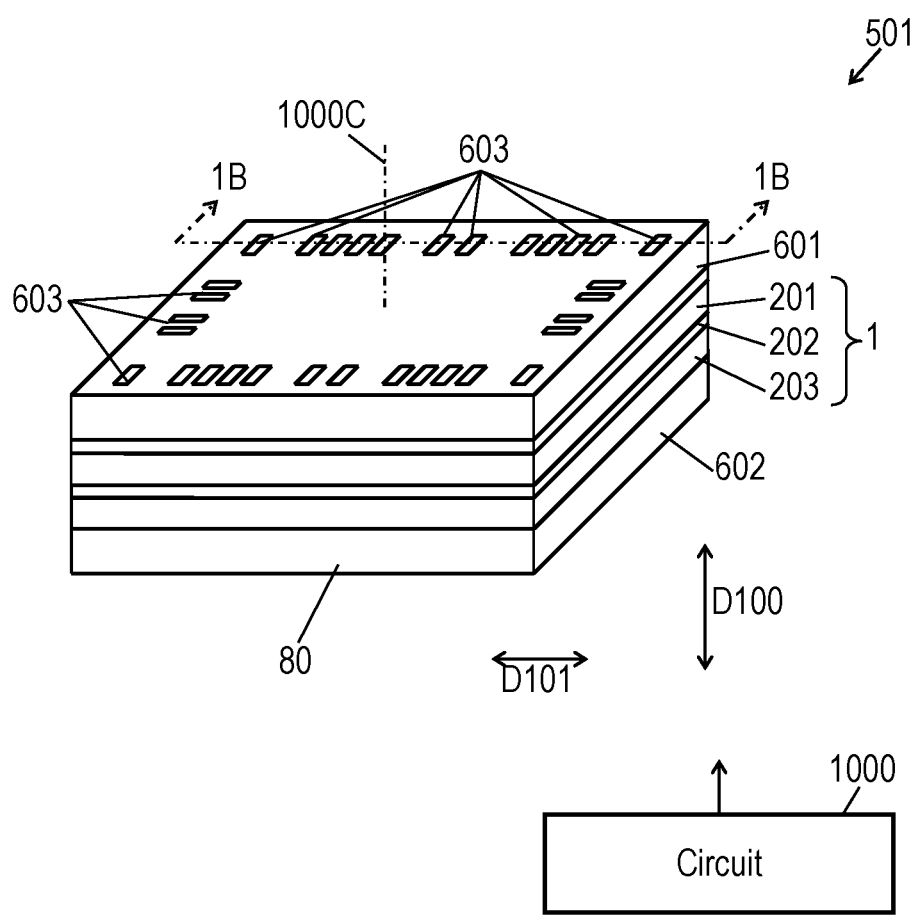
FIG. 1A is a perspective view of a sensor according to an exemplary embodiment.
Figure 1B:
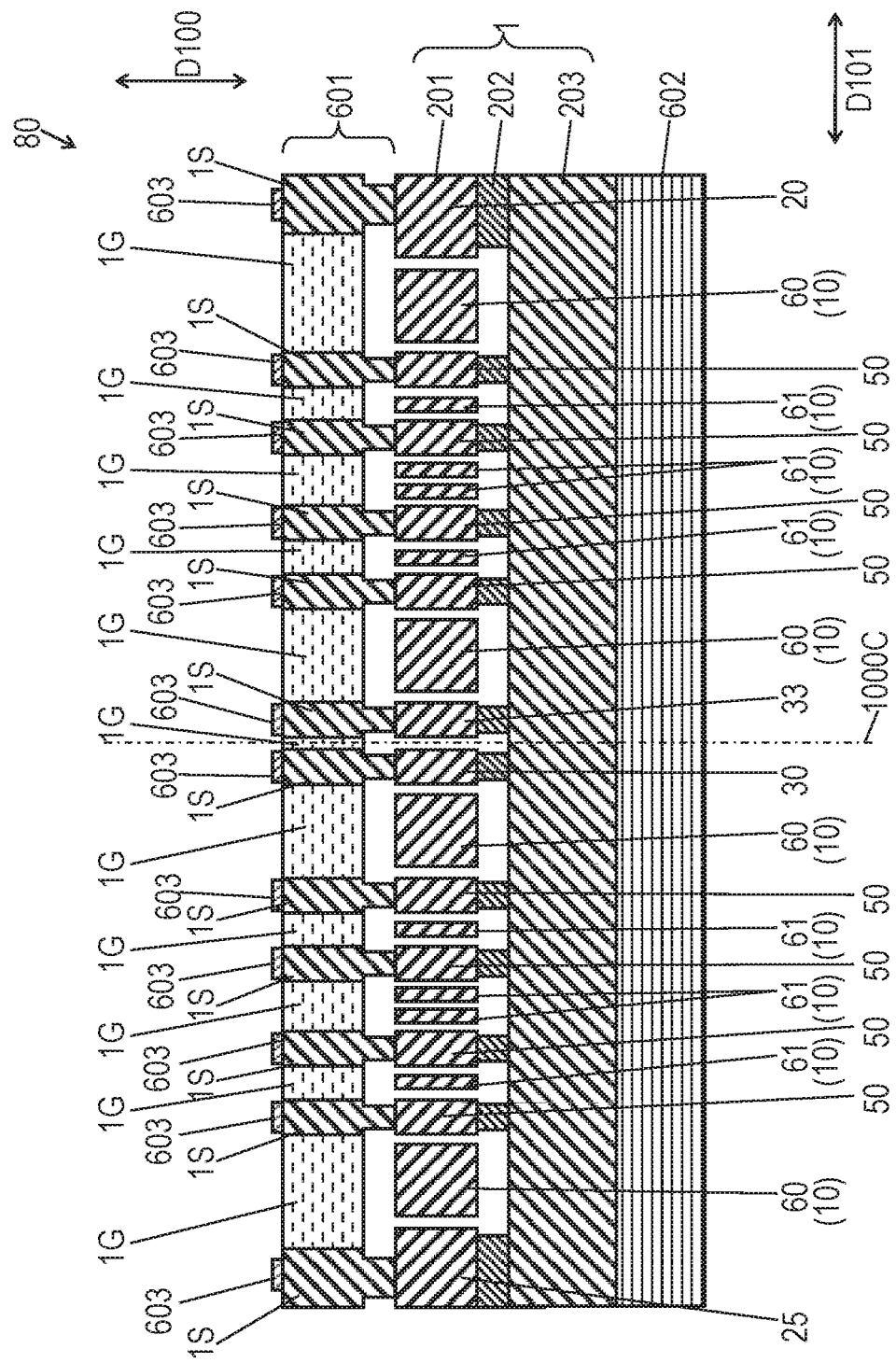
FIG. 1B is a cross-sectional view of the sensor along line 1B-1B shown in FIG. 1A.

FIG. 1A is a perspective view of sensor 501 according to an exemplary embodiment. FIG. 1B is a cross-sectional view of sensor 501 along line 1B-1B shown in FIG. 1A. Sensor 501 according to the embodiment is an angular velocity sensor for detecting an angular velocity. Sensor 501 includes sensor substrate 1, upper lid substrate 601 joined to an upper surface of sensor substrate 1, lower lid substrate 602 joined to a lower surface of sensor substrate 1, and electrodes 603 disposed on an upper surface of upper lid substrate 601. Upper lid substrate 601, sensor substrate 1, and lower lid substrate 602 are thus stacked in up-down direction D100. Sensor substrate 1 includes support layer 203, sacrificial layer 202 joined to an upper surface of support layer 203, and active layer 201 joined to an upper surface of sacrificial layer 202. Active layer 201, sacrificial layer 202, and support layer 203 are thus stacked in up-down direction D100. An upper surface of active layer 201 constitutes the upper surface of sensor substrate 1. A lower surface of support layer 203 CONSTITUTES the lower surface of sensor substrate 1.

Figure 1C:
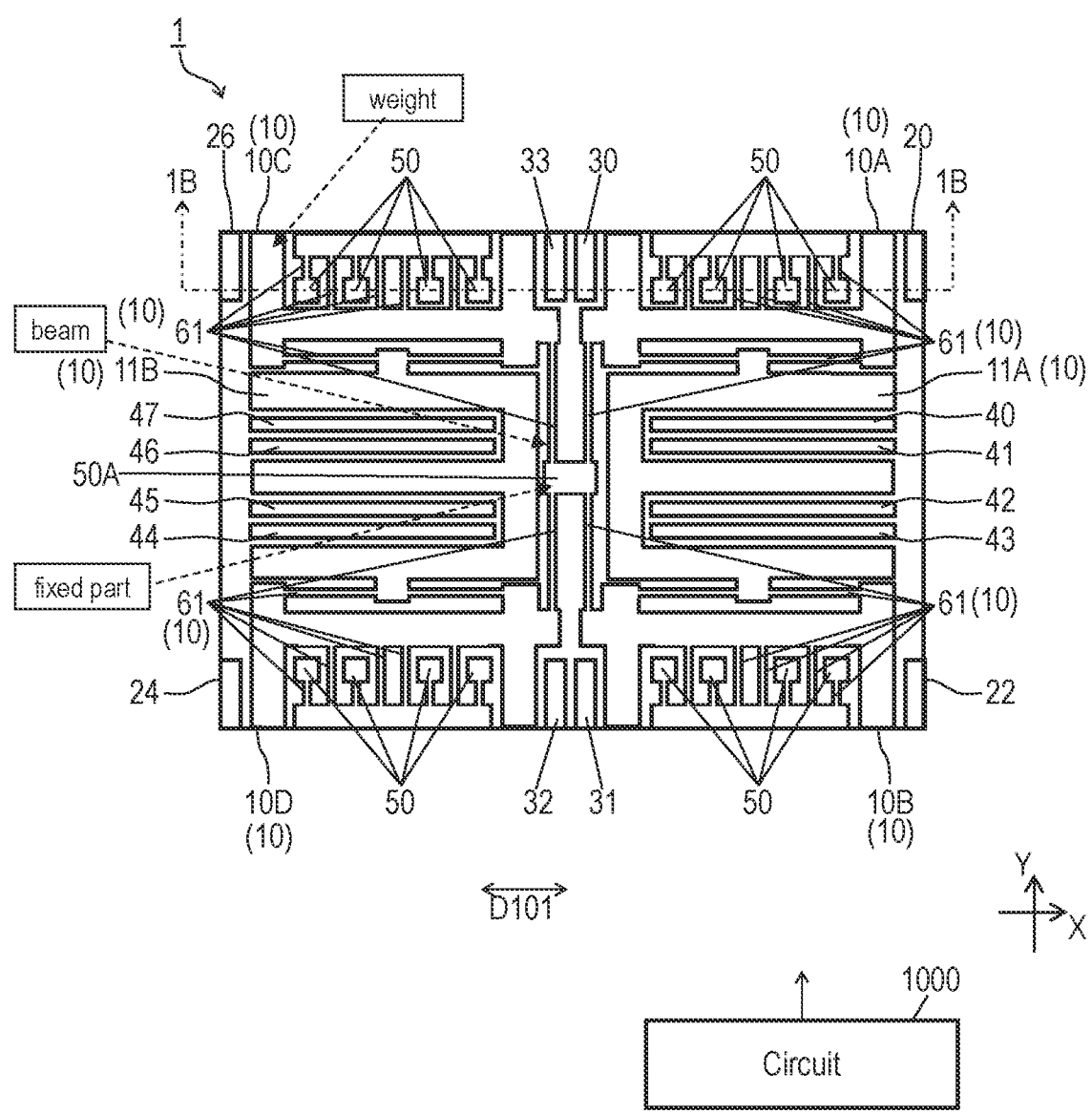
FIG. 1C is a top view of a sensor substrate of the sensor according to the embodiment.

FIG. 1C is a top view of active layer 201 of sensor substrate 1.

Sensor substrate 1 includes fixed part 50 and movable part 10 movably connected to fixed part 50. Movable part 10 includes beam 61 connected to fixed part 50 and weight 60 connected to beam 61. Weight 60 is movable relative to fixed part 50. Weight 60 is coupled to fixed part 50 via beam 61. As shown in FIG. 1B, fixed part 50 of sensor substrate 1 is fixed to support layer 203 via sacrificial layer 202. Sensor substrate 1 further includes drive electrodes 20 to 27, monitor electrodes 30 to 33, and detection electrodes 40 to 47. These electrodes are fixed to support layer 203 via sacrificial layer 202 while not being displaceable relative to fixed part 50.

Movable part 10 faces the upper surface of support layer 203 in up-down direction D100 which being located away from the upper surface by a constant distance. Movable part 10 is connected to and supported movably by fixed part 10 via beam 61.

The width of beam 61 in up-down direction D100 perpendicular to the upper surface of support layer 203 is larger than the width of beam 61 in direction D101 which is perpendicular to up-down direction D100 of beam 61 and which is parallel to the upper surface of support layer 203. This configuration allows beam 61 to be bent and deform more easily in direction D101 than in up-down direction D100, thus allowing the beam to less easily bent and deformed in up-down direction D100 than in direction D101. Accordingly, weight 60 coupled to fixed part 50 via beam 61 is displaced relative to fixed part 50 easily in direction D101, but is displaced relative to fixed part 50 less easily in up-down direction D100 than in direction D101.

Weight 60 of movable part 10 includes drive weights 10A to 10D and detection weights 11A and 11B.

Drive weights 10A to 10D and detection weights 11A and 11B are connected to beams 61, respectively.

Drive weights 10A to 10D are coupled via beams 61 to fixed part 50A that is located at a center of movable part 10. Beams 61 supports drive weights 10A to 10D such that the drive weights can be displaced in a drive direction.

Detection weight 11A is coupled to drive weights 10A and 10B via beam 61. Beam 61 supports detection weight 11A such that the detection weight can be displaced in a detection direction.

Detection weight 11B is coupled to drive weights 10C and 10D via beam 61. Beam 61 supports detection weight 11B such that the detection weight can be displaced in the detection direction.

An operation of sensor substrate 1 will be described below.

When drive weights 10A to 10D are each displaced relative to fixed part 50 in the drive direction by respective drive electrodes 20 to 27, the displacements are transferred to detection weights 11A and 11B, respectively, thereby displacing detection weights 11A and 11B relative to fixed part 50.

Voltages are applied to drive electrodes 20 to 27 from circuit 1000 including circuit elements, such as an integrated circuit (IC), thereby driving corresponding parts of movable part 10 by electrostatic driving. Drive electrode 20 drives drive weight 10A of movable part 10. Drive electrode 22 drives drive weight 10B of movable part 10. Drive electrode 24 drives drive weight 10D of movable part 10. Drive electrode 26 drives drive weight 10C of movable part 10.

Each of monitor electrodes 30 to 33 detects capacitance, in the drive direction, of a corresponding part of movable part 10, and feeds the thus-detected capacitance back to circuit 1000. In circuit 1000, there are built a capacitance-voltage (C/V) converter circuit for converting capacitance into a voltage, a phase-locked loop (PLL) circuit, etc. With this configuration, voltages are output to drive electrodes 20 to 27 such that every part of movable part 10 can vibrates with a constant amplitude at a constant period.

Detection electrodes 40 to 47 detect capacitances of corresponding parts of movable part 10 in the detection direction, and output the detected capacitances to circuit 1000. Detection electrodes 40 to 43 detect the displacement of detection weight 11A. Detection electrodes 44 to 47 detect the displacement of detection weight 11B. These displacements are caused by the Coriolis force which is attributed to the displacements of movable part 10 in the drive direction and the rotation about center axis 100C. The center axis extends in up-down direction D100 perpendicular to both the drive direction and the detection direction. These displacements are caused by acceleration as well applied to sensor substrate 1.

Circuit 1000 converts the output capacitances into voltages, and subjects the voltages to a periodical inversion processing to generate a detection signal. Then, circuit 1000 averages the generated detection signal to generate an angular velocity signal, and outputs the angular velocity signal. The angular velocity signal indicates an angular velocity about center axis 1000C extending in up-down direction D100 perpendicular to both the detection direction and the drive direction.

Circuit 1000 also detects an acceleration, not by performing the inversion processing, but by detecting direct-current components of signals that are supplied from detection electrodes 40 to 47 and are generated attributed to an inertial force.

A method of manufacturing sensor substrate 1 will be described below. FIGS. 2 to 5 are cross-sectional views of sensor substrate 1 for illustrating the method of manufacturing sensor substrate 1. FIGS. 2 to 5 schematically show the structure of sensor substrate 1 shown in FIG. 1B.

Figure 2:
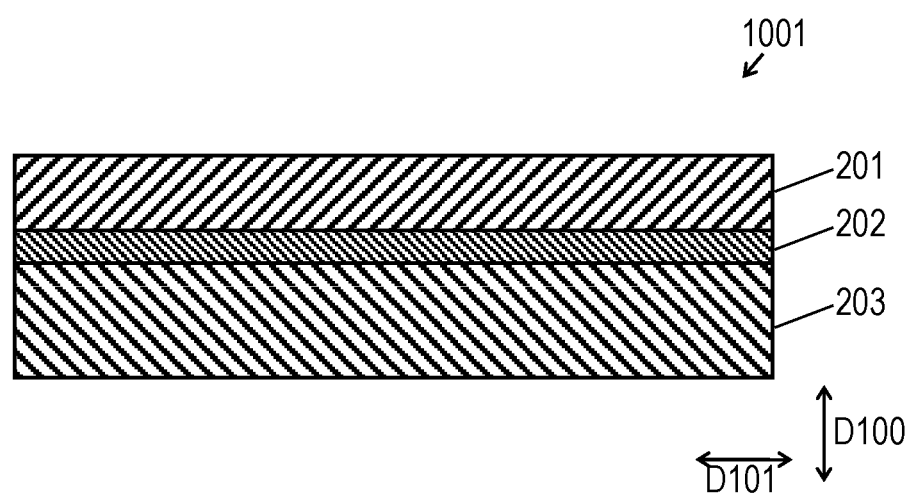
FIG. 2 is a cross-sectional view of the sensor according to the embodiment for illustrating a method of manufacturing the sensor.

First, silicon-on-insulator (SOI) substrate 1001 shown in FIG. 2 is prepared. SOI substrate 1001 includes active layer 201 made of low-resistance silicon, sacrificial layer 202 made of silicon oxide ($SiO_2$), and support layer 203 made of silicon. Active layer 201 is disposed on an upper surface of sacrificial layer 202. Sacrificial layer 202 is disposed on an upper surface of support layer 203. Active layer 201, sacrificial layer 202, and support layer 203 are thus stacked in this order in up-down direction D100.

Figure 3:
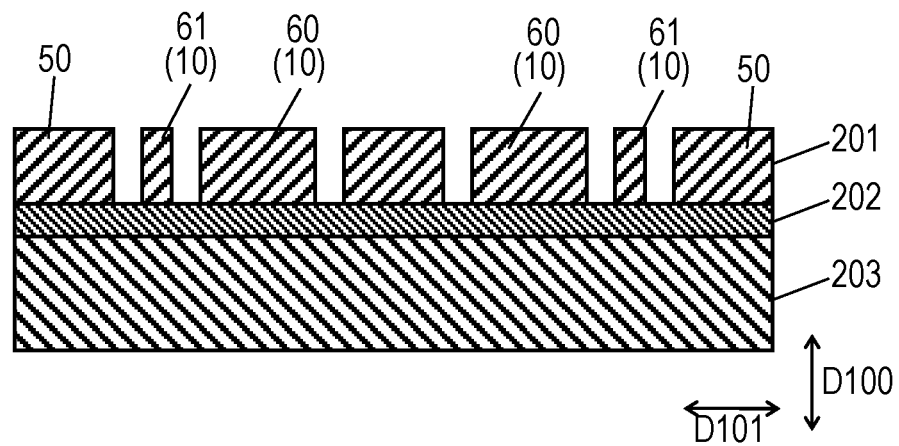
FIG. 3 is a cross-sectional view of the sensor according to the embodiment for illustrating the method of manufacturing the sensor.

Next, as shown in FIG. 3, active layer 201 is processed to become movable part 10. In this process, a masking process is performed by, e.g. photolithography, and then, active layer 201 is subjected to dry-etching with, e.g. fluorine-based gas until sacrificial layer 202 is exposed. The processing of active layer 201 is not limited to this. Instead of this, various kinds of processing may be applied.

Figure 4:
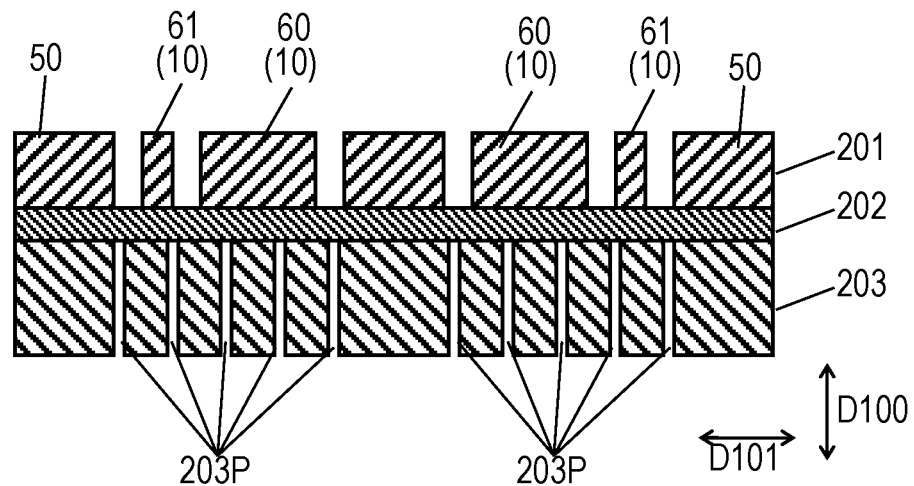
FIG. 4 is a cross-sectional view of the sensor according to the embodiment for illustrating the method of manufacturing the sensor.

Next, as shown in FIG. 4, support layer 203 is etched to form plural through-holes 203P that penetrate support layer 203 from the upper surface to the lower surface of the support layer. Through-holes 203P are disposed at positions that face movable part 10 in up-down direction D100. More specifically, through-holes 203P are disposed at the positions that face both weight 60 and beam 61 in up-down direction D100. In accordance with the embodiment, a part of support layer 203 facing movable part 10 in up-down direction D100 has a mesh structure configured with plural through-holes 203P.

Figure 5:
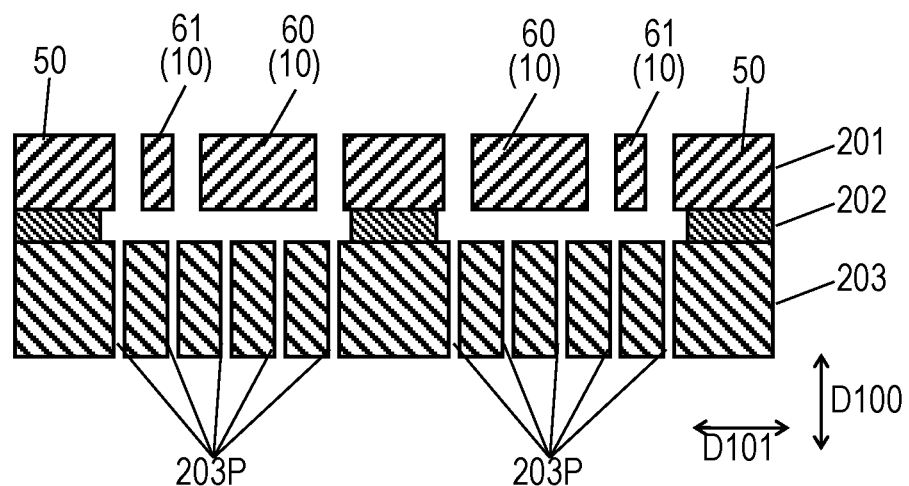
FIG. 5 is a cross-sectional view of the sensor according to the embodiment for illustrating the method of manufacturing the sensor.

Next, as shown in FIG. 5, fluorine-based gas is introduced via through-holes 203P to partially etch sacrificial layer 202 by dry-etching, thereby partially removing the sacrificial layer. Specifically, a part of sacrificial layer 202 facing through-holes 203P is removed, hence separating movable part 10 from support layer 203. On the other hand, a part of sacrificial layer 202 which is to be fixed part 50 of active layer 201 remains as it is, thus still fixed to support layer 203. Upper lid substrate 601, lower lid substrate 602, and sensor substrate 1 constitute sensor device 80.

Instead of through-holes 203P of support layer 203, a part of active layer 201 which is to be movable part 10 may have through-holes therein that form a mesh-like structure. This configuration allows sacrificial layer 202 to be partially etched to remove the sacrificial layer in the same way as described above. However, in this case, an energy loss occurs due to strains appearing around the through-holes, and reduces a Q-value, resulting in a decrease in the signal-to-noise (S/N) ratio of the sensor.

In sensor substrate 1 of sensor device 80 according to the embodiment, as shown in FIG. 5, no through-hole is provided in any part of active layer 201 that is to be movable part 10, but through-holes 203P are provided in parts of support layer 203 that face movable part 10. This configuration reduces the energy loss described above, and maintains the Q-value ay high level, accordingly increasing the S/N ratio of sensor device 80.

Each of through-holes 203P provided in support layer 203 shown in FIGS. 4 and 5 has a cylindrical column shape with a constant diameter over from the upper surface to the lower surface of support layer 203. However, through-hole 203P may have another shape.

Figure 6A:
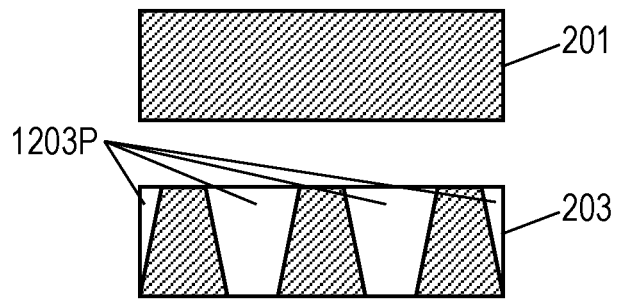
FIG. 6A is an enlarged cross-sectional view of the sensor according to the embodiment.

FIG. 6A is an enlarged cross-sectional view of sensor device 80 with through-holes having another shape. Support layer 203 shown in FIG. 6A is provided with through-holes 1203P, instead of through-holes 203P shown in FIGS. 4 and 5, at the positions where through-holes 203P are to be disposed. Positions on through-holes 1203P have diameters that increase as the positions shift from the lower surface to the upper surface of support layer 203. That is, through-hole 1203P flares toward movable part 10, i.e. active layer 201. This configuration reduces the contact area between sacrificial layer 202 and support layer 203, significantly reducing the time of the etching of sacrificial layer 202.

Figure 6B:
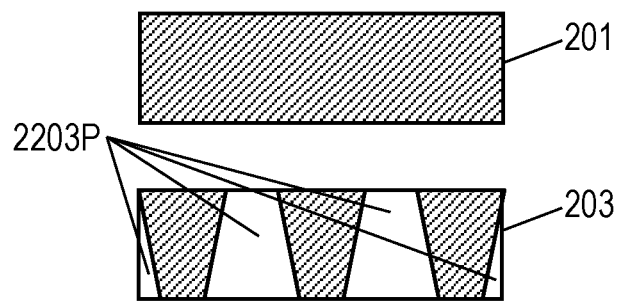
FIG. 6B is an enlarged cross-sectional view of the sensor according to the embodiment.

FIG. 6B is an enlarged cross-sectional view of sensor device 80 which is provided with through-holes having still another shape. Support layer 203 shown in FIG. 6B is provided with through-holes 2203P, instead of through-holes 203P shown in FIGS. 4 and 5, at the positions where through-holes 203P are to be disposed. Positions on through-holes 2203P have diameters that decreases as the positions shifted from the lower surface to the upper surface of support layer 203. That is, through-hole 1203P tapers toward movable part 10, i.e. active layer 201. This configuration allows, when etching sacrificial layer 202, easy infiltration of an etchant, such as etching-gas, into sacrificial layer 202. This easy infiltration prevents the yield of products from decreasing due to, e.g. defects of etching.

Figure 6C:
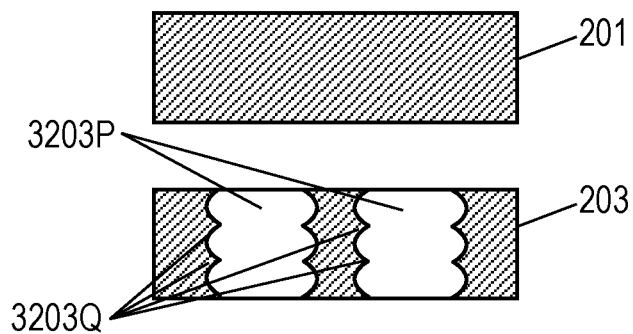
FIG. 6C is an enlarged cross-sectional view of the sensor according to the embodiment.

FIG. 6C is an enlarged cross-sectional view of sensor device 80 which is provided with through-holes having a further shape. Support layer 203 shown in FIG. 6C is provided with through-holes 3203P, instead of through-holes 203P shown in FIGS. 4 and 5, at the positions where through-holes 203P are to be disposed. Through-hole 3203P includes one or more constriction portions 3203Q each of which has a locally-reduced diameter. This configuration allows, when etching sacrificial layer 202, an etchant to infiltrate into the layer at high rates, resulting in a decrease in the time needed to etch the layer.

Figure 7A:
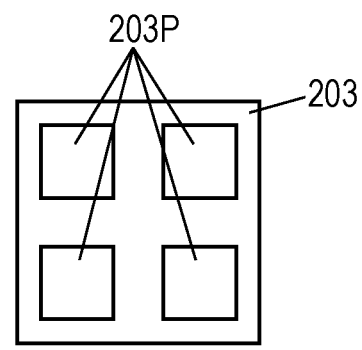
FIG. 7A is a top view of a support layer of the sensor substrate of the sensor according to the embodiment.
Figure 7B:
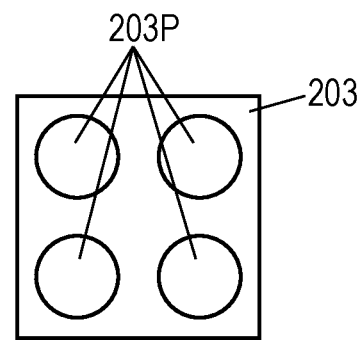
FIG. 7B is a top view of a support layer of the sensor substrate of the sensor according to the embodiment.
Figure 7C:
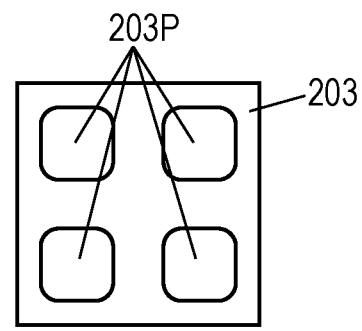
FIG. 7C is a top view of a support layer of the sensor substrate of the sensor according to the embodiment.

FIGS. 7A to 7C are top views of support layer 203 of sensor substrate 1, and show the shapes of openings of through-holes 203P which open at the upper surface of support layer 203. Each of the shapes is shown as a cross-section of through-hole 203P along direction D101 perpendicular to up-down direction D100. The cross-section of through-hole 203P shown in FIG. 7A has a circular shape. The cross-section of through-hole 203P shown in FIG. 7B has a polygonal shape with rounded corners. The cross-section of through-hole 203P shown in FIG. 7C has a polygonal shape with vertex corners. In the cases where the cross-section of through-hole 203P has a polygonal shape with vertices as shown in FIG. 7B, stresses concentrate at the vertices, and may cause failures, such as a crack, of support layer 203. The cross-section of through-hole 203P having either a circular shape or a polygon shape with rounded corners, as shown in FIGS. 7B and 7C, prevent strains from concentrating at the corners, and prevent failures, such as a crack, of support layer 203.

Figure 8:
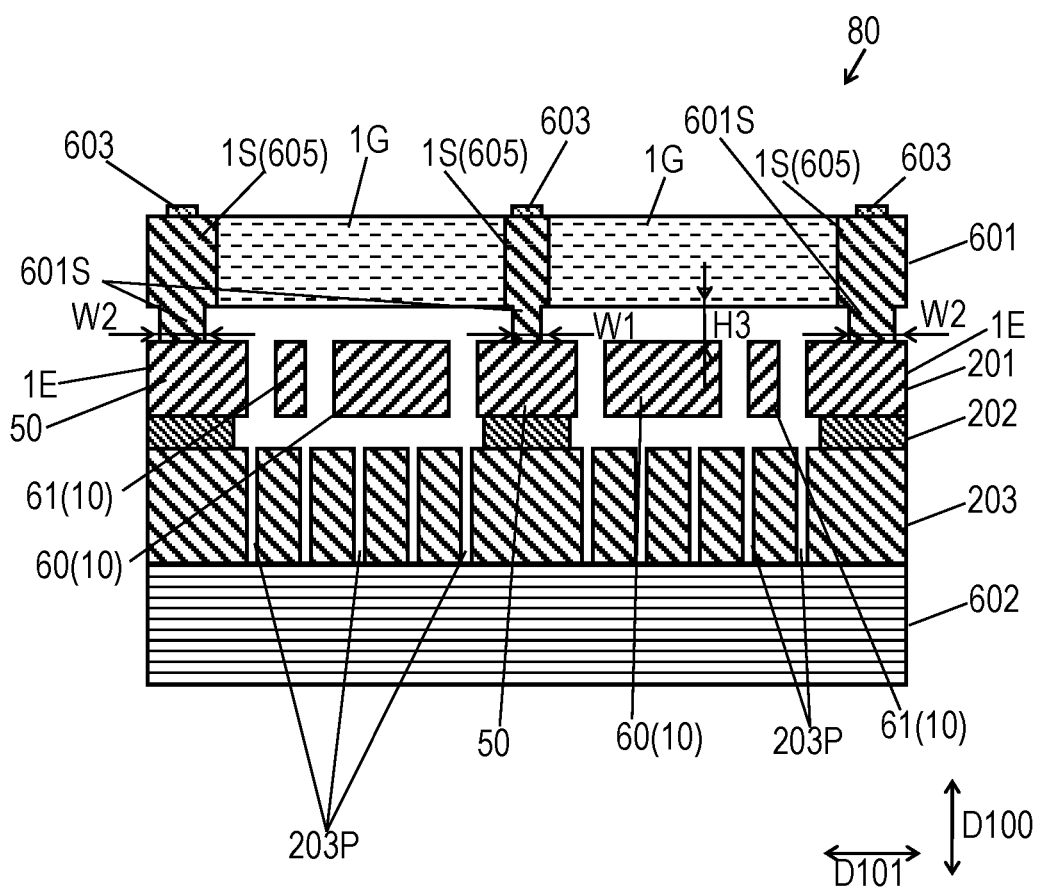
FIG. 8 is a cross-sectional view of the sensor according to the embodiment.

FIG. 8 is a cross-sectional view of sensor device 80. As shown in FIG. 8, upper lid substrate 601 is joined to the upper surface of sensor substrate 1, i.e. the upper surface of active layer 201. Lower lid substrate 602 is joined to the lower surface of sensor substrate 1, i.e. the lower surface of support layer 203, such that the lower lid substrate covers through-holes 203P, thus providing sensor device 80.

Lower lid substrate 602 is made of silicon. Etching holes provided in support layer 203 allows sensor device 80 to be sealed in vacuum by Si—Si room-temperature direct bonding by silicon in lower lid substrate 602 and support layer 203. Such a bonding technique provides one or two orders of magnitude higher degree of vacuum, over other bonding techniques such as anodic bonding, diffusion bonding, and eutectic bonding. This increases the Q-value of sensor device 80 at high level, accordingly increasing an S/N ratio. The Si—Si room-temperature direct bonding is performed in room temperature, and reduces residual stresses due to wafer strains caused by the bonding process over other bonding techniques described above. For example, this configuration reduces a temperature drift of sensor device 80.

The thickness of upper lid substrate 601 in up-down direction D100 is equal to the thickness of lower lid substrate 602 in up-down direction D100. The material of upper lid substrate 601 is identical to the material of lower lid substrate 602. This configuration decreases strains caused by an external stress, decreasing a temperature drift of sensor device 80. Through-holes 203P provided in support layer 203 eliminates additional through-holes for etching to form beam 61 that supports weight 60. This configuration provides great degree of freedom in frequency-designing for sensor device 80.

Upper lid substrate 601 of sensor device 80 shown in FIGS. 1B and 8 includes parts 1S and parts 1G. Parts 1S contain silicon while parts 1G contain glass. Each part 1S containing silicon includes projection 601S that protrudes toward sensor substrate 1. Part 1S has an electrical conduction property, and constitutes via-electrode 605 that penetrates upper lid substrate 601 from the upper surface to the lower surface of the substrate. Parts 1G containing glass have an electrical insulation property.

Figure 9A:
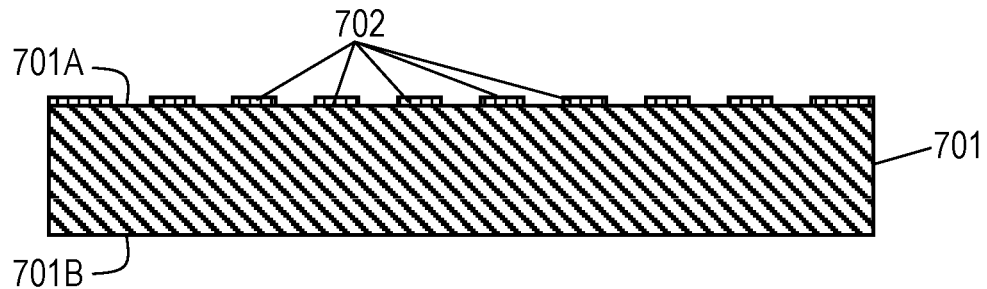
FIG. 9A is a cross-sectional view of an upper lid substrate of the sensor according to the embodiment for illustrating a method of manufacturing the upper lid substrate.

FIGS. 9A to 9G are cross-sectional views of upper lid substrate 601 for illustrating a method of manufacturing upper lid substrate 601. As shown in FIG. 9A, wafer 701 made of silicon and having surfaces 701A and 701B opposite to each other is prepared. Parts of wafer 701 constitute via-electrodes 605 of upper lid substrate 601. In order to reduce the resistance of each of via-electrodes 605, the specific resistance of wafer 701 has an appropriate value preferably not larger than 1 Ω·cm. Mask 702 for Si-etching is formed on Si-wafer 701 with such a specific resistance by, e.g. photolithography or dry/wet etching. The material of mask 702 may be an organic resist. The mask may be a hard mask that is made of material, such as $SiO_2$, or $Si_3N_4$, other than the organic resist.

Figure 9B:
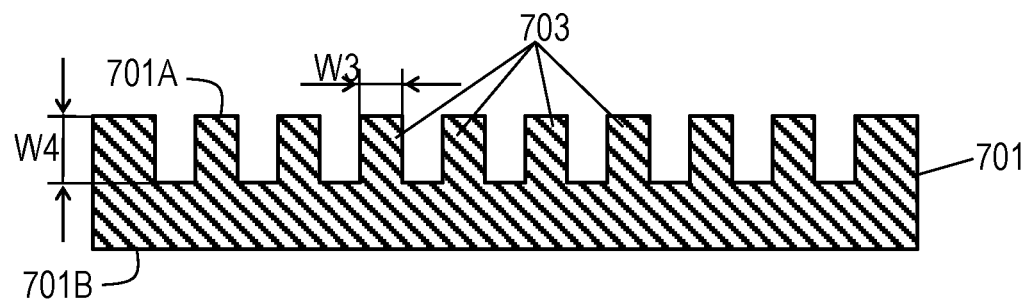
FIG. 9B is a cross-sectional view of the upper lid substrate of the sensor according to the embodiment for illustrating the method of manufacturing the upper lid substrate.

After mask 702 is formed, surface 701A of wafer 701 is subjected to Si-deep etching, so called Bosch Process, in which the wafer is deeply etched by process-gas containing $SF_6$ and $O^2$ and process gas containing $C_4F_8$. This configuration forms projections 703 that protrude to surface 701A, as shown in FIG. 9B.

Figure 9C:
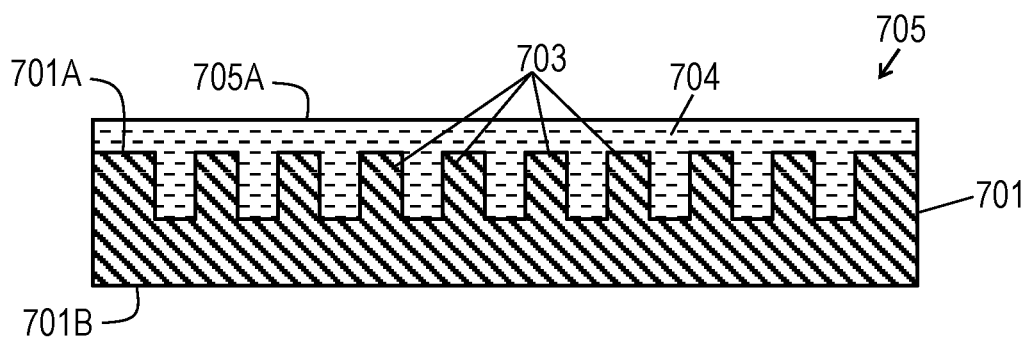
FIG. 9C is a cross-sectional view of the upper lid substrate of the sensor according to the embodiment for illustrating the method of manufacturing the upper lid substrate.

Next, glass wafer 704 made of glass is melt on surface 701A of wafer 701 having projections 703 by heating, thereby filling the glass into recesses between projections 703 to form composite substrate 705, as shown in FIG. 9C. Composite substrate 705 has surface 705A opposite to surface 701B. The closer to the coefficient of thermal expansion of wafer 701 glass wafer 704 is, the greater the advantageous effects are in sensor characteristics and, in particular, a temperature drift.

Figure 9D:
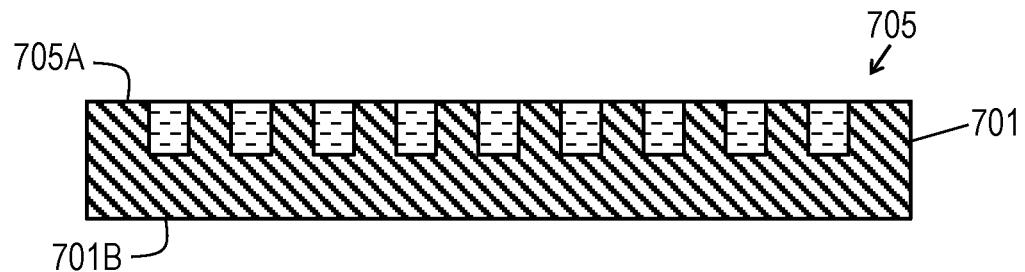
Figure 9E:
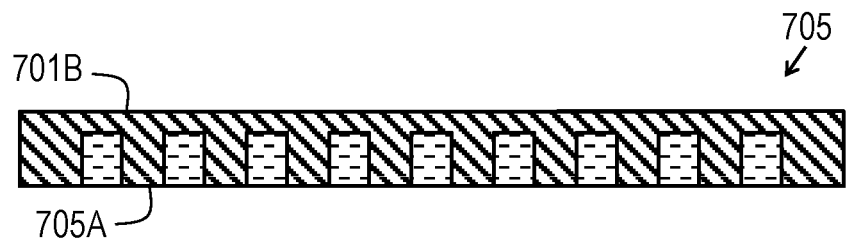
FIG. 9E is a cross-sectional view of the upper lid substrate of the sensor according to the embodiment for illustrating the method of manufacturing the upper lid substrate.
Figure 9F:
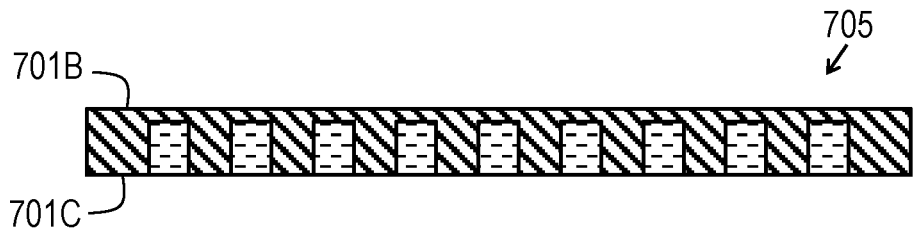
FIG. 9F is a cross-sectional view of the upper lid substrate of the sensor according to the embodiment for illustrating the method of manufacturing the upper lid substrate.

Next, as shown in FIG. 9D, surface 705A of composite substrate 705 is ground and polished with, e.g. a grinder or a lapping machine until projections 703 are exposed. After that, as shown in FIG. 9E, composite substrate 705 is turned upside down. Then, surface 701B of composite substrate 705 is ground with, e.g. a grinder to have a shape in which the composite wafer is thinned but glass wafer 704 still remains not exposed. In this case, after having finished a certain amount of the grinding and polishing, in order to remove a process-affected layer and flatten the surface, surface 701B of composite substrate 705 is flattened by chemical-mechanical polishing (CMP), as shown in FIG. 9F. For performing the Si—Si direct bonding described above, the surface roughness Ra of surface 701B of composite substrate 705 is not larger than 1 nm, and preferably not larger than 0.5 nm.

Figure 9G:
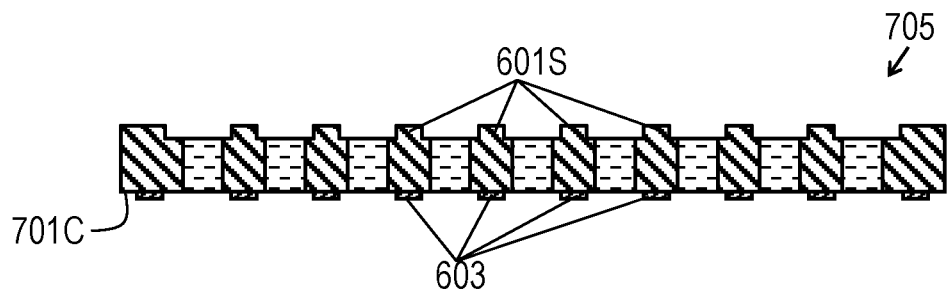
FIG. 9G is a cross-sectional view of the upper lid substrate of the sensor according to the embodiment for illustrating the method of manufacturing the upper lid substrate.

After that, as shown in FIG. 9G, surface 701B of composite substrate 705 is dry-etched to form projections 601S with a resist mask formed on the surface by photolithography, thereby providing upper lid substrate 601.

Projections 601S may be formed by another method. For example, a film may be formed on each of surfaces 701B and 705A of composite substrate 705 with a material, such as $SiO_2$, resistant to strong alkalis. The film is made by, e.g. low pressure-chemical vapor deposition (LP-CVD) or plasma-chemical vapor deposition (CVD). Then, the material is processed to form a hard mask. Then, surface 701B of composite substrate 705 may be etched by strong alkali, such as potassium hydroxide (KOH) or tetramethyl ammonium hydroxide (TMAH), to form projections 601S in surface 701B.

After that, as shown in FIG. 9G electrodes 603 are formed on surface 701C of composite substrate 705 by sputtering or depositing metal for wiring onto the surface. These electrodes are to be coupled to the respective electrodes, i.e. drive electrodes 20 to 27, monitor electrodes 30 to 33, and detection electrodes 40 to 47. This completes upper lid substrate 601. Then, as shown in FIG. 8, projections 601S are joined to the upper surface of sensor substrate 1 by Si—Si room-temperature direct bonding. Electrodes 603 are coupled through via-electrodes 605 to the respective electrodes, i.e. drive electrodes 20 to 27, monitor electrodes 30 to 33, and detection electrodes 40 to 47. Electrodes 603 may be formed, as wiring, by patterning on surface 701C of composite substrate 705.

Alternatively, before electrodes 603 are formed, projections 601S of composite substrate 705 may be joined to the upper surface of sensor substrate 1 by Si—Si room-temperature direct bonding. Then, if necessarily, a film may be formed on surface 701C of composite substrate 705 by sputtering or depositing metal for wiring, and then, is pattered to form a wiring layer.

The shape of each of projections 703 shown in FIGS. 9B and 9C is determined such that the projection is not broken by loads and the like when melting glass wafer 704 by heating. In accordance with the embodiment, the aspect ratio of projection 703 which is the ratio of thickness W4 in up-down direction D100 to width W3 in direction D101 is preferably not larger than three.

The width of projection 601S of each of via-electrodes 605 is not necessarily equal the width of a part of the via-electrode 605 embedded in the glass. According to purpose, the width of the projection may be larger than that of the part of via-electrode 605 embedded in the glass or smaller than that. The aspect ratio which is the ratio of height H3 of projection 601S in up-down direction D100 to width W1 (W2) of projection 601S in direction D101 is preferably not larger than three such that the projection is not broken by loads when upper lid substrate 601 is joined to sensor substrate 1. All of projections 601S are do not necessarily have the same shape. As shown in FIG. 8, width W2 in direction D101 of projection 601S positioned closer to outer edge 1E of sensor substrate 1 than other projections 601S may be larger than width W1 in direction D101 of projection 601S positioned closer to the center of sensor substrate 1 than other projection 601S. This configuration preferably increases the strength of the periphery of sensor substrate 1.

Figure 10:
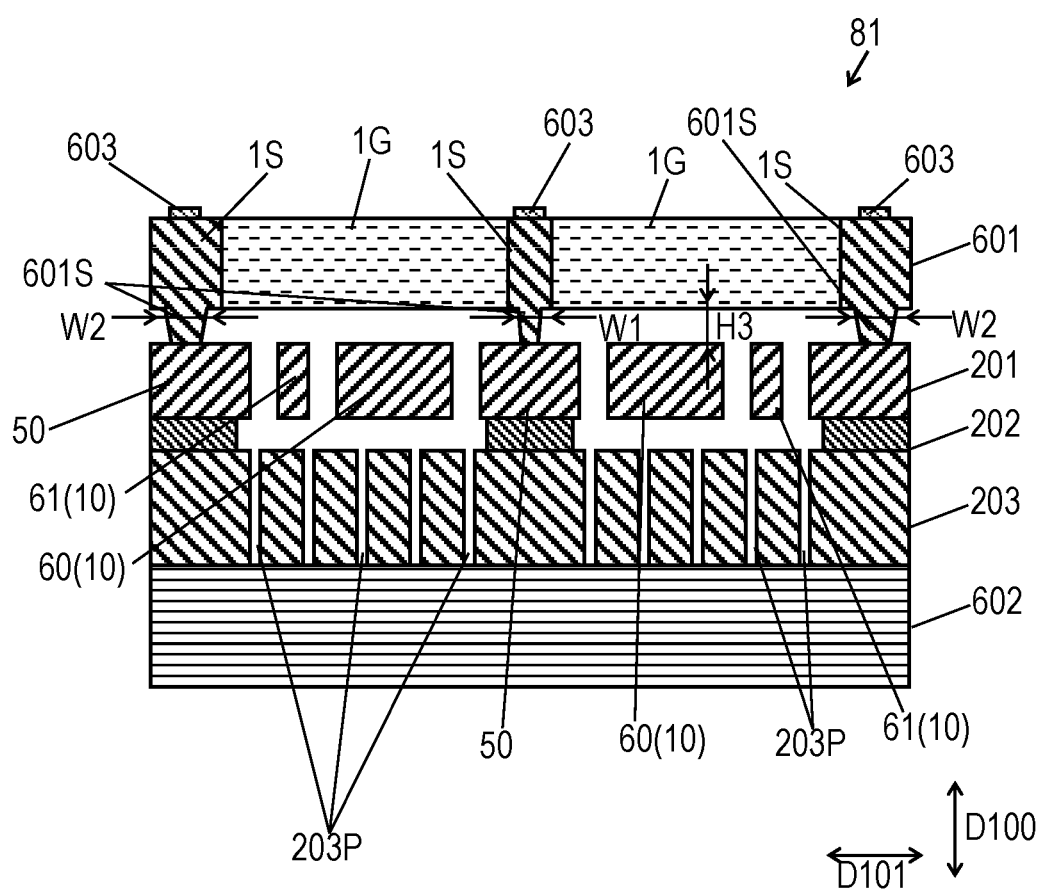
FIG. 10 is a cross-sectional view of another sensor according to the embodiment.
Figure 11A:
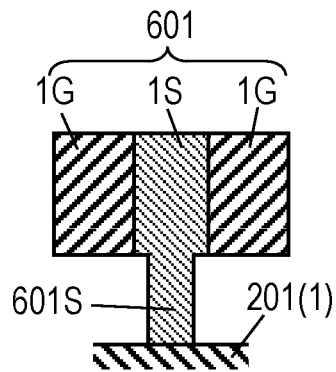
FIG. 11A is an enlarged cross-sectional view of the sensor according to the embodiment.
Figure 11B:
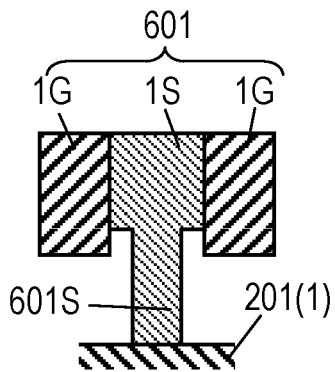
FIG. 11B is an enlarged cross-sectional view of the sensor according to the embodiment.
Figure 11C:
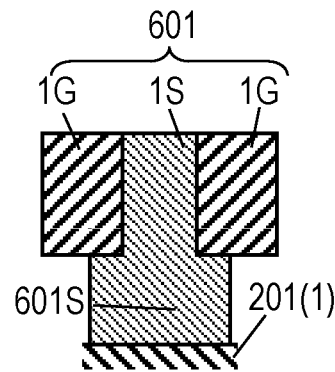
FIG. 11C is an enlarged cross-sectional view of the sensor according to the embodiment.
Figure 11D:
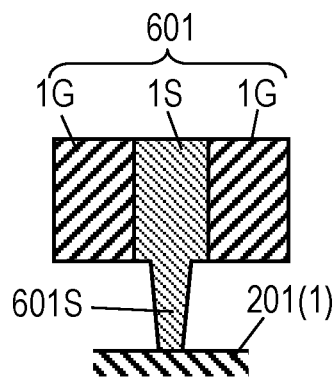
FIG. 11D is an enlarged cross-sectional view of the sensor according to the embodiment.
Figure 11E:
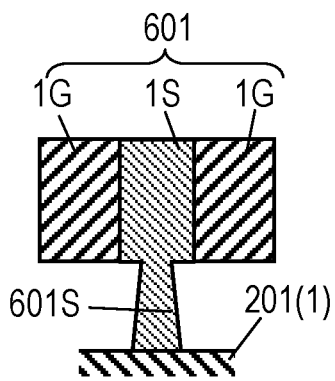
FIG. 11E is an enlarged cross-sectional view of the sensor according to the embodiment.
Figure 11F:
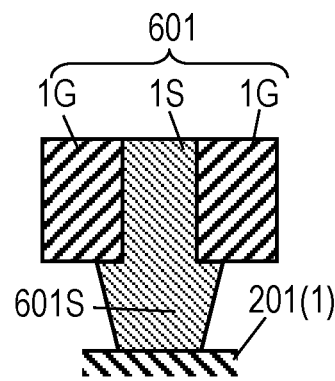
FIG. 11F is an enlarged cross-sectional view of the sensor according to the embodiment.
Figure 11G:
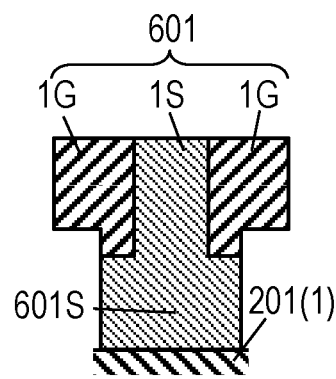
FIG. 11G is an enlarged cross-sectional view of the sensor according to the embodiment.
Figure 11H:
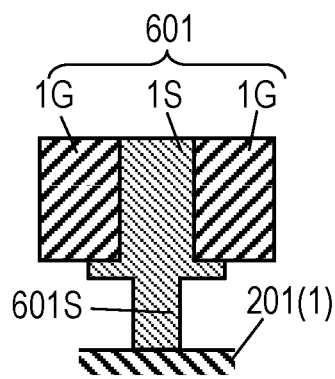
FIG. 11H is an enlarged cross-sectional view of the sensor according to the embodiment.
Figure 11I:
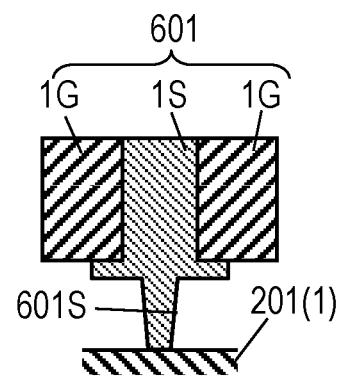
FIG. 11I is an enlarged cross-sectional view of the sensor according to the embodiment.

FIG. 10 is a cross-sectional view of another sensor device 81 according to the embodiment. In FIG. 10, components identical to those of FIG. 8 are denoted by the same reference numerals. When wafer 701 with a (001) plane direction is subjected to the strong-alkali processing described above, projection 601S has a tapered shape in which the width of the projection tapers toward sensor substrate 1, as shown in FIG. 10. Projection 601S is not limited to the shapes shown in FIGS. 8 and 10, and may have another shape.

FIGS. 11A to 11I are cross-sectional views of upper lid substrates 601 each of which includes projections 601S having other shapes.

In each of the conventional sensor devices, in order to take out electrical potentials from the sensor device, a wiring pattern is formed on the sensor device or, alternatively, a part of the active layer of the sensor device functions as a wiring. This results in longer or narrow wiring, thereby causing parasitic capacitance and parasitic resistance. In sensor device 80 according to the embodiment, via-electrodes 605 are provided in upper lid substrate 601, and allows electrical potentials to be taken out from the electrodes by short-distance and thick wirings. Moreover, silicon pieces serving as the via-electrodes are dispersed in the thick glass substrate made of low-dielectric constant material. This configuration remarkably reduces parasitic capacitance and parasitic resistance, improving the S/N ratio of sensor device 80.

Upper lid substrate 601 is joined to sensor substrate 1 by the Si—Si room-temperature direct bonding. This configuration allows sensor device 80 to be sealed in one or two orders of magnitude higher degree of vacuum ($10^{-3}$ Pa), over other bonding techniques, such as anodic bonding, diffusion bonding, and eutectic bonding. This increases the Q-value of sensor device 80 to a high level, and provides a high sensitivity and S/N ratio of sensor device 80. Moreover, since the direct bonding is performed in room temperature, it brings about another advantage, over other bonding techniques, that strains in the substrate are less prone to occur during the bonding, resulting in a decrease in residual stresses, which are accumulated in the substrate, after the bonding. For example, sensor device 80 has a small temperature drift. In addition, the room-temperature direct bonding eliminates the depositing of a material, such as a metal for bonding, other than Si and $SiO_2$ on either sensor substrate 1 or upper lid substrate 601 prior to the bonding. Therefore, an inexpensive wafer can be prepared as the substrate material.

Moreover, the absence of a metal layer for bonding results in absence of foreign matters that possibly enter in a process of depositing the metal layer. Furthermore, it allows use of general-purpose cleaning solutions, such as sulfuric acid-peroxide mixture or ammonia-peroxide mixture, having high ability to remove foreign matters. In addition, since the direct bonding is performed between the surfaces on which only extremely trace amounts of foreign matters can be present, it guarantees a high bonding yield for sensor device 80. Moreover, since most of regions of upper lid substrate 601 are made of glass, the inside of sensor device 80 may be observed with, e.g. an optical microscope. This configuration allows patterning failures and foreign matters to be found in sensor device 80.

Figure 12:
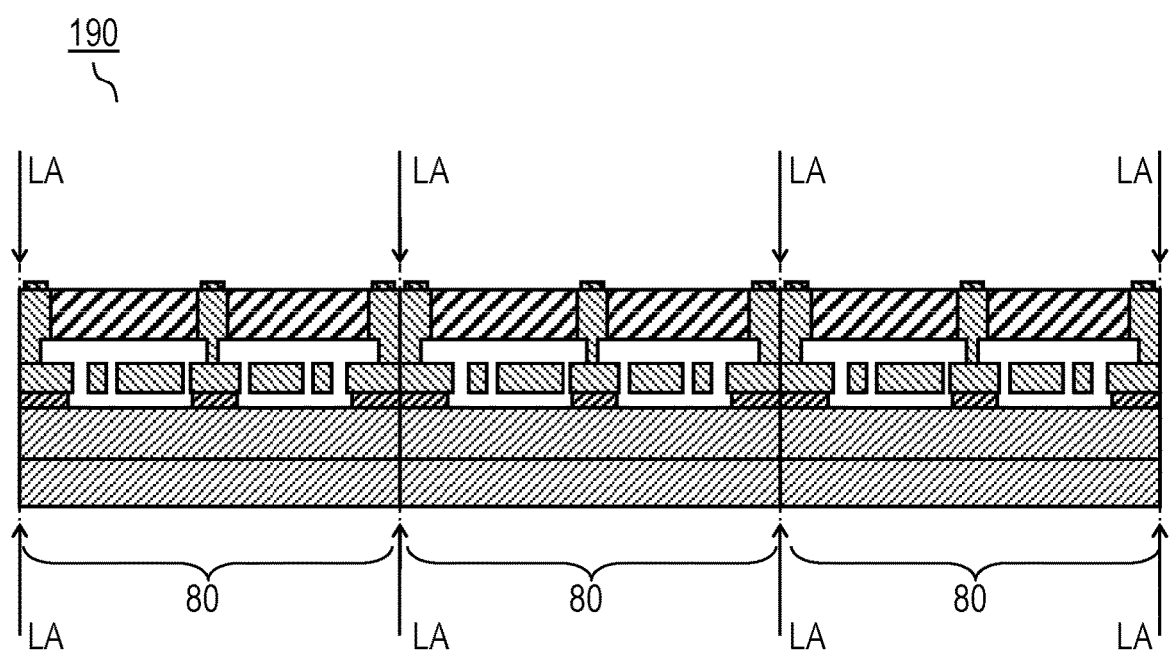
FIG. 12 is a cross-sectional view of a sensor device according to the embodiment for illustrating a method of manufacturing the sensor device.

Moreover, electrodes 603 formed as the wiring on the upper surface of upper lid substrate 601 provide greater degree of freedom in, such as, coupling the electrodes by wire bonding to a signal processing circuit, i.e. an application-specific integrated circuit (ASIC). In addition, since only Si is the material that encloses the device, the wafer can be separated into device chips not only by blade dicing but also by stealth dicing. The stealth dicing prevents blade-attributed chip problems including: damage, sticking due to occurrence of static electricity, and burrs at the periphery of each of the chips. FIG. 12 is a cross-sectional view of wafer 190 having plural sensor devices 80 formed therein. Specifically, as shown in FIG. 12, boundaries between sensor devices 80 on both the front and back sides of the wafer are irradiated with an yttrium aluminum garnet (YAG) laser LA with the wavelength of about 1053 $cm^{-1}$. Then, wafer 190 is stuck on a film. Then, the film is expanded while the wafer is stuck on the film. This allows the wafer to be separated into sensor devices 80 without chipping.

Figure 13:
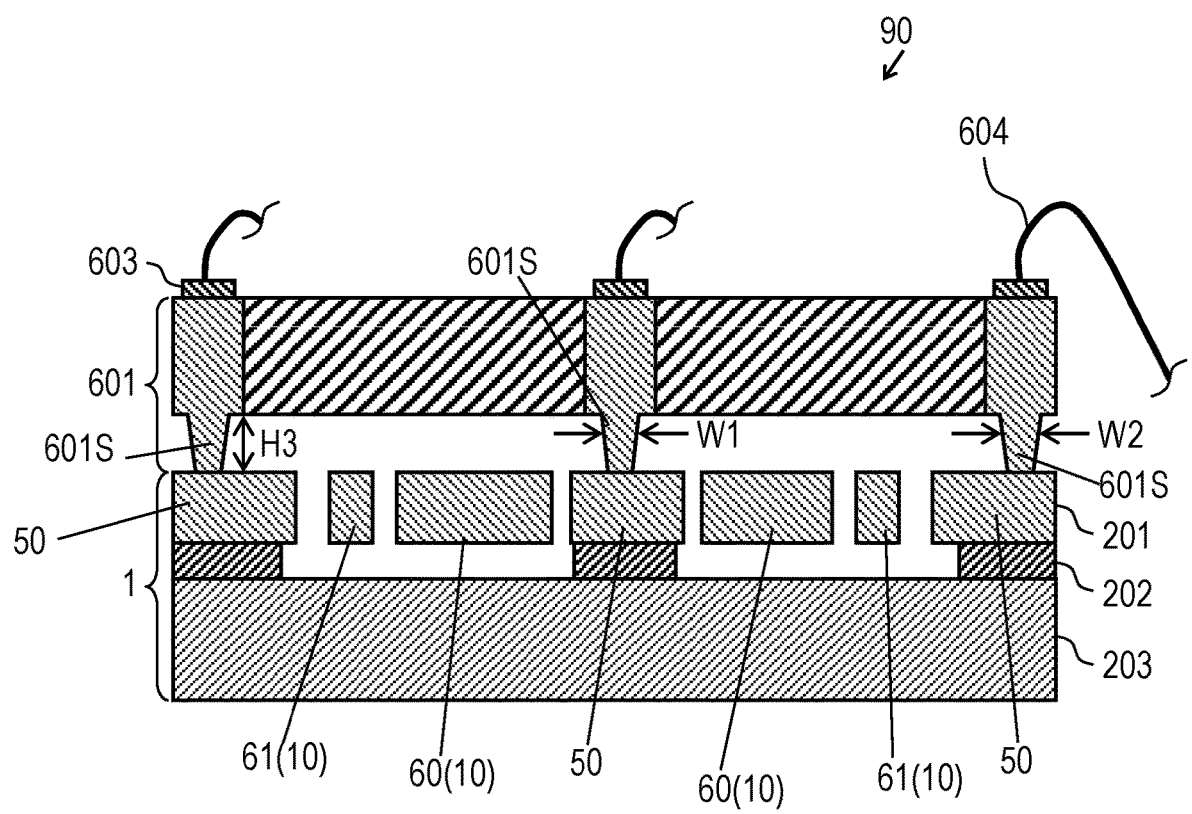
FIG. 13 is a cross-sectional view of another sensor according to the embodiment.

In sensor device 80 shown in FIG. 8, sensor device 80 includes support layer 203 having plural through-holes 203P therein used for etching. FIG. 13 is a cross-sectional view of another sensor device 90 according to the embodiment. In FIG. 13, components identical to those of sensor devices 80 and 81 shown in FIGS. 8 and 10 are denoted by the same reference numerals. In sensor device 90 shown in FIG. 13, no through-hole is formed in support layer 203. Although sensor device 90 does not include lower lid substrate 602, support layer 203 without any through-hole provides the airtightness of the vacuum sealing.

Figure 14:
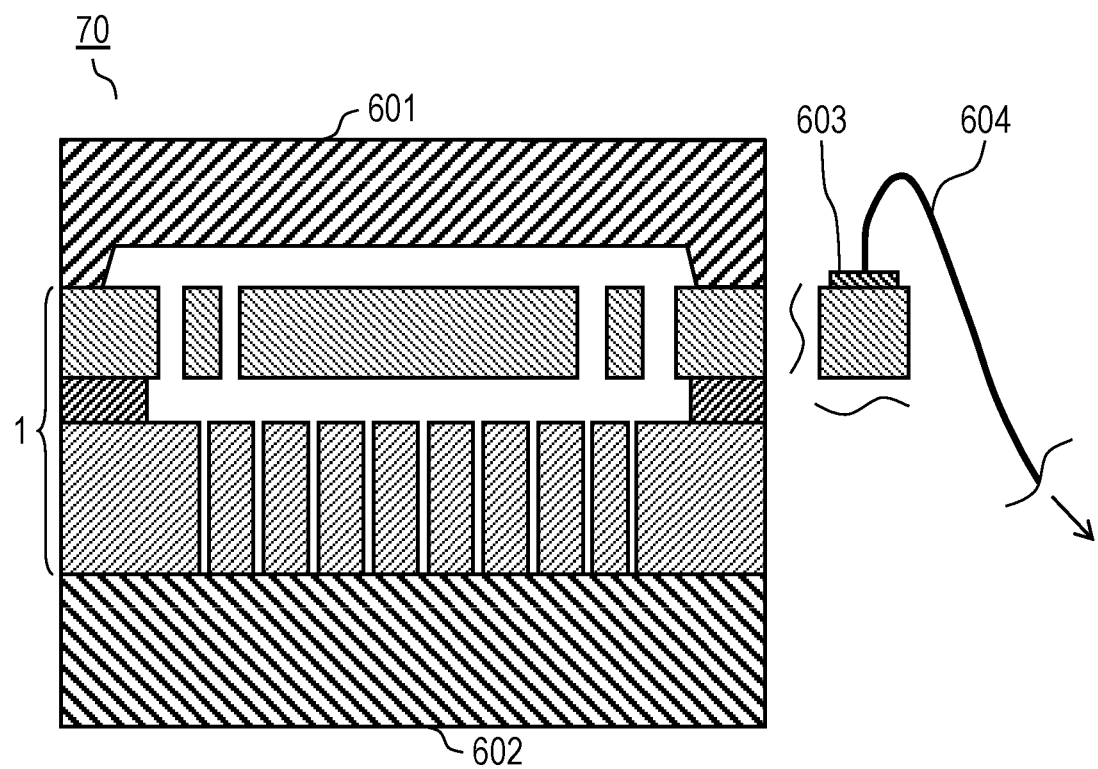
FIG. 14 is a cross-sectional view of still another sensor according to the embodiment.

FIG. 14 is a cross-sectional view of yet still sensor device 70 according to the embodiment. In FIG. 14, components identical to those of sensor device 80 shown in FIG. 8 are denoted by the same reference numerals. In sensor device 70 shown in FIG. 14, electrodes 603 are disposed on sensor substrate 1. Electrodes 603 are connected to metal wires 604 to be coupled to circuit 1000.

Figure 15A:
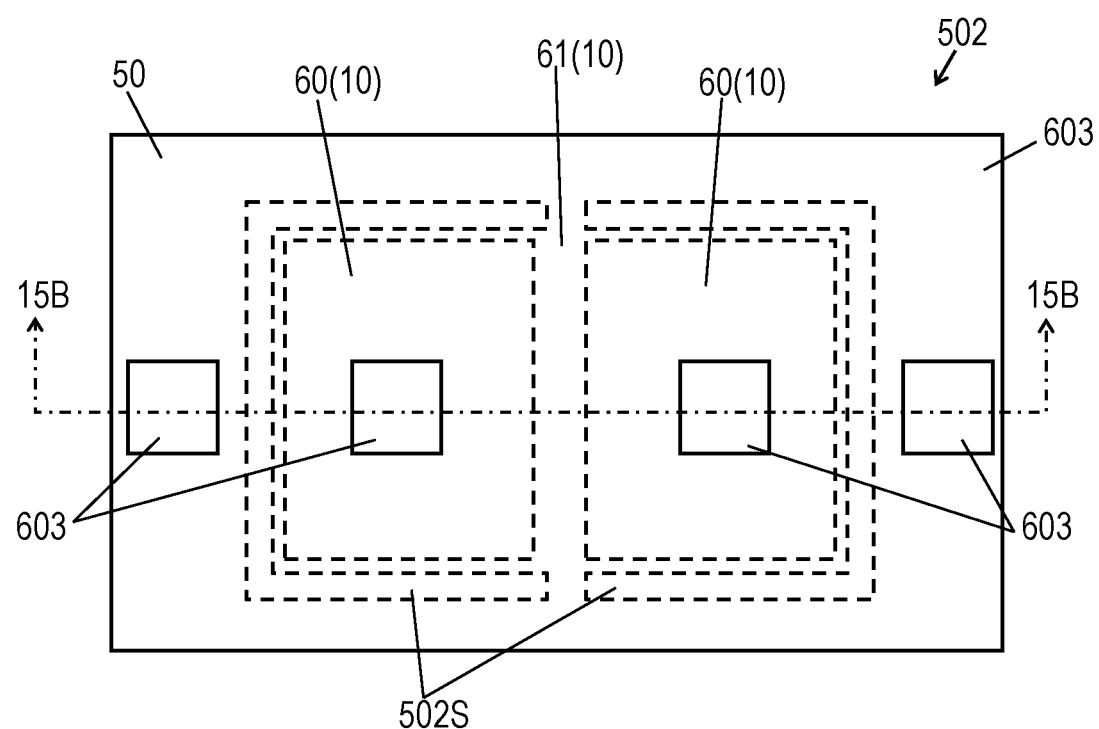
FIG. 15A is a top view of a further sensor according to the embodiment.
Figure 15A:
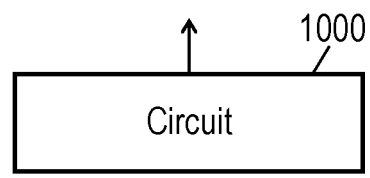
Figure 15B:
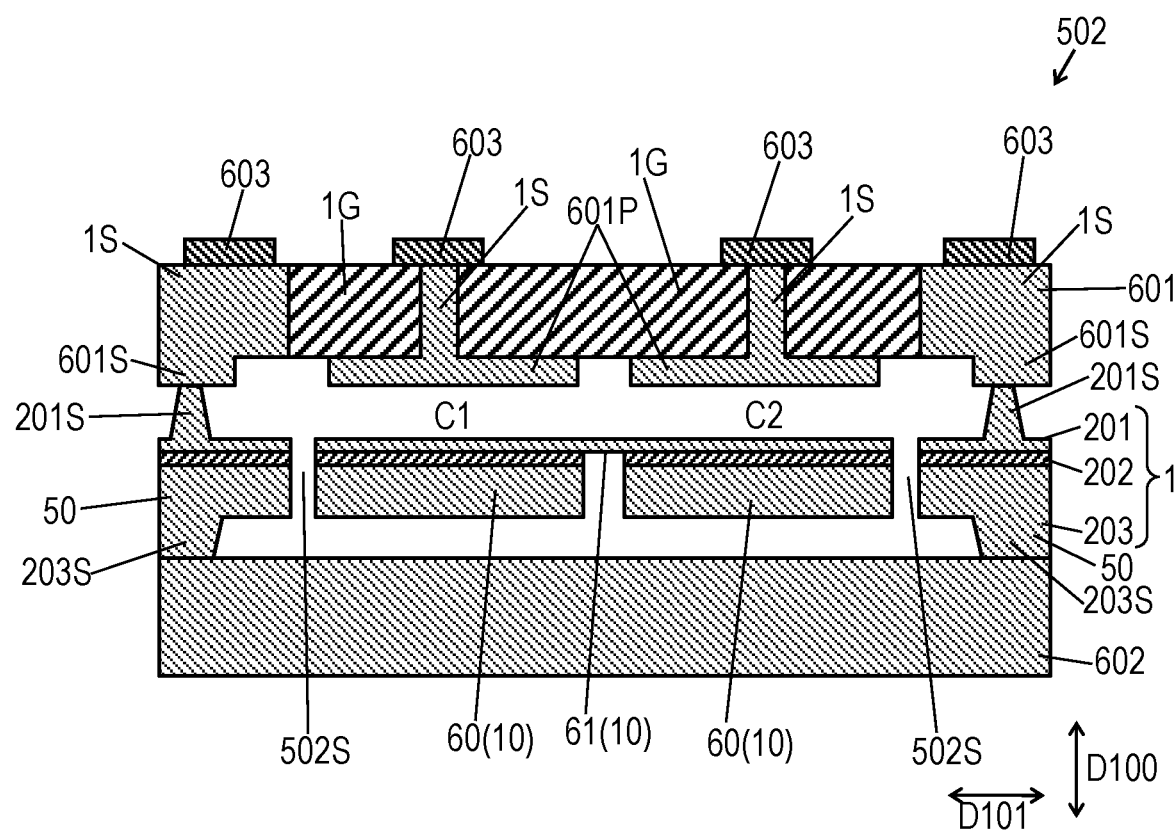
FIG. 15B is a cross-sectional view of the sensor along line 15B-15B shown in FIG. 15A.
Figure 15B:
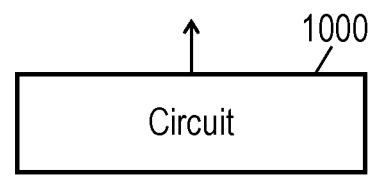

FIG. 15A is a top view of further sensor 502 according to the embodiment. FIG. 15B is a cross-sectional view of sensor 502 along line 15B-15B shown in FIG. 15A. In FIGS. 15A and 15B, components identical to those of sensor 501 shown in FIGS. 1A to 1C are denoted by the same reference numerals.

Sensor 502 is an acceleration sensor for detecting acceleration. Similarly to sensor 501 shown in FIGS. 1A to 1C, sensor 502 includes sensor substrate 1, upper lid substrate 601 joined to the upper surface of sensor substrate 1, and lower lid substrate 602 joined to the lower surface of sensor substrate 1. Upper lid substrate 601, sensor substrate 1, and lower lid substrate 602 are stacked in up-down direction D100.

Sensor substrate 1 includes fixed part 50 joined to both upper lid substrate 601 and lower lid substrate 602, and includes movable part 10 movably connected to fixed part 50. Movable part 10 includes beam 61 connected to fixed part 50 and two weights 60 connected to beam 61. Sensor substrate 1 includes active layer 201 made of silicon, sacrificial layer 202 made of silicon oxide ($SiO_2$) on the lower surface of active layer 201, and support layer 203 made of silicon on the lower surface of sacrificial layer 202. Active layer 201, sacrificial layer 202, and support layer 203 constitute both fixed part 50 and movable part 10. In sensor 502 shown in FIGS. 15A and 15B, sensor substrate 1 includes projections 201S and 203S. Projection 201S protrudes toward upper lid substrate 601 and is joined to upper lid substrate 601. Projection 203S protrudes toward lower lid substrate 602 and is joined to lower lid substrate 602.

Upper lid substrate 601 includes parts 1G and parts 1S joined to parts 1G. Parts 1G contain glass while parts 1S contain silicon. Parts 1G containing glass have electrical insulation properties. Parts 1S containing silicon have electrical conductive properties. Upper lid substrate 601 includes two electrodes 601P that face two respective weights 60 with respective clearances in up-down direction D100. Electrodes 603 are disposed on the upper surface of upper lid substrate 601 and joined to parts 1S having electrical conductive properties. Electrodes 601P are electrically connected to electrodes 603 via parts 1S.

An operation of sensor 502 to detect acceleration will be described below.

When an acceleration in up-down direction D100 is applied to sensor 502, beam 61 deforms and bends. This either causes two weights 60 to rotate about beam 61 such that the weights are displaced to approach together electrodes 601P, or causes two weights 60 to rotate about beam 61 such that the weights are displaced to be removed away from electrodes 601P. This displacement changes each of capacitances C1 and C2 formed between respective one of weights 60 and respective one of electrodes 601P facing respective one of weights 60. Based on the changes of capacitances C1 and C2, circuit 1000 connected to weights 60 and electrodes 601P via electrodes 603 detects the acceleration applied to sensor 502.

When acceleration in direction D101 perpendicular to up-down direction D100 is applied to sensor 502, beam 61 deforms and bents. This causes one of two weights 60 to rotate about beam 61 such that the one of two weights 60 is displaced to approach electrodes 601P, and causes the other of two weights 60 to rotate about beam 61 such that the other of two weights 60 is displaced to be removed away from electrodes 601P. This configuration changes each of capacitances C1 and C2 formed between respective one of weights 60 and respective one of electrodes 601P, facing the respective one of the weights. Based on the changes of capacitances C1 and C2, circuit 1000 connected to weights 60 and electrodes 601P via electrodes 603 detects the acceleration applied to sensor 502.

A method of manufacturing sensor 502 will be described below. FIGS. 16A to 16F are cross-sectional views of sensor 502 for illustrating the method of manufacturing sensor 502.

Upper lid substrate 601 is manufactured by the processes shown in FIGS. 9A to 9G. Particularly in the process shown in FIG. 9G, electrodes 601P are formed simultaneously to projections 601S by the pattern of the resist mask disposed on surface 701B of composite substrate 705 and appropriately designed.

Next, with reference to FIGS. 16A to 16F, the method of manufacturing sensor 502 will be described. Throughout FIGS. 16A to 16F, in manufacturing equipment for processing each layer, the up-down direction indicated in FIGS. 16A to 16F may be reversed.

Figure 16A:
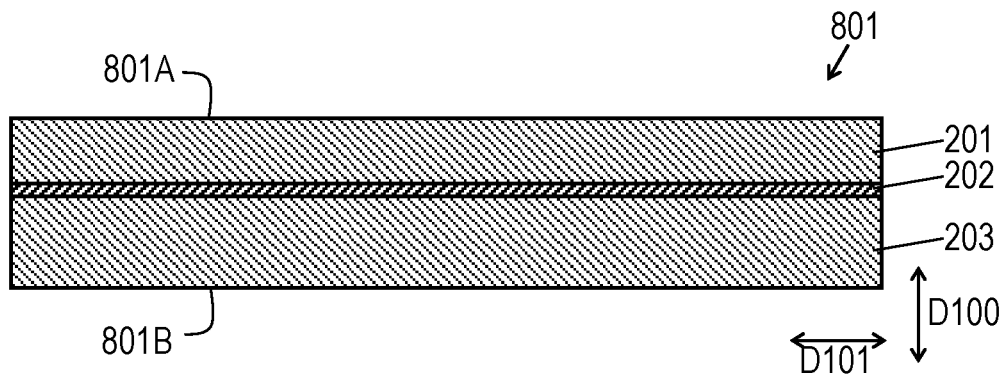
FIG. 16A is a cross-sectional view of the sensor shown in FIGS. 15A and 15B for illustrating a method of manufacturing the sensor.

SOI substrate 801 is prepared. SOI substrate 801 includes active layer 201 made of silicon, sacrificial layer 202 made of silicon oxide ($SiO_2$) disposed on the lower surface of active layer 201, and support layer 203 made of silicon disposed on the lower surface of sacrificial layer 202. As shown in FIG. 16A, films 801A and 801B made of $SiO_2$ are formed on the upper and the lower surfaces of SOI substrate 801, respectively. After that, resist patterns are formed on films 801A and 801B by, e.g. photolithography. Then, films 801A and 801B are patterned with these resist patterns to form masks configured with films 801A and 801B on the upper and lower surfaces of SOI substrate 801, respectively.

Figure 16B:
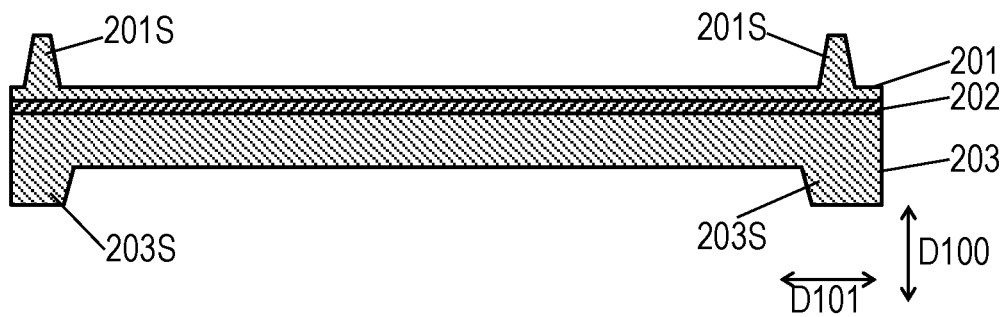
FIG. 16B is a cross-sectional view of the sensor shown in FIGS. 15A and 15B for illustrating the method of manufacturing the sensor.

Then, by, e.g. anisotropic wet etching with the masks described above, projection 201S is formed on the upper surface of active layer 201 of SOI substrate 801 and projection 203S is formed on the lower surface of support layer 203 of SOI substrate 801, as shown in FIG. 16B.

Figure 16C:
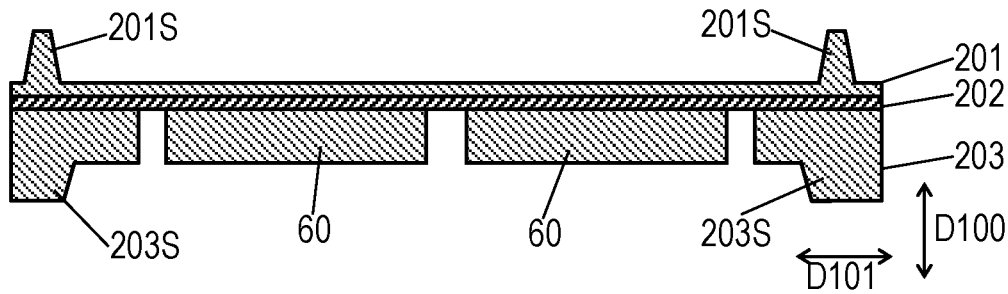
FIG. 16C is a cross-sectional view of the sensor shown in FIGS. 15A and 15B for illustrating the method of manufacturing the sensor.

After that, a resist pattern is formed on the lower surface of support layer 203 by, e.g. photolithography. Next, as shown in FIG. 16C, weights 60 are formed by etching support layer 203 by Bosch Process from the lower surface of support layer 203 until sacrificial layer 202 is exposed from the lower surface of support layer 203.

Figure 16D:
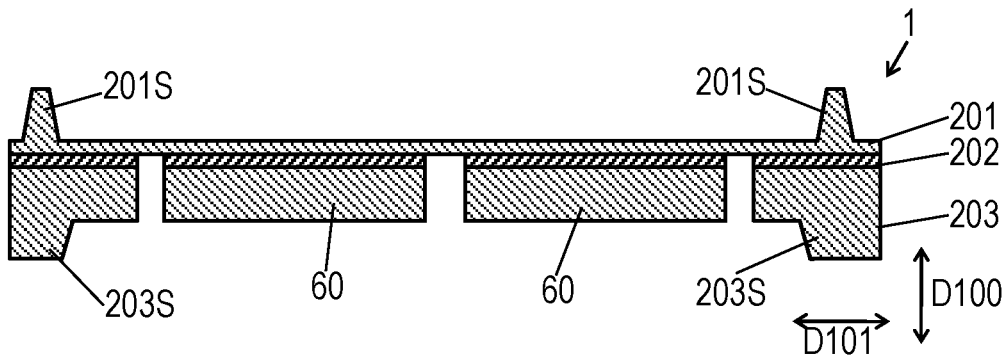
FIG. 16D is a cross-sectional view of the sensor shown in FIGS. 15A and 15B for illustrating the method of manufacturing the sensor.

Then, as shown in FIG. 16D, the lower surface of sacrificial layer 202 which is exposed through support layer 203 is dry etched until active layer 201 is exposed from the lower surface of sacrificial layer 202.

Figure 16E:
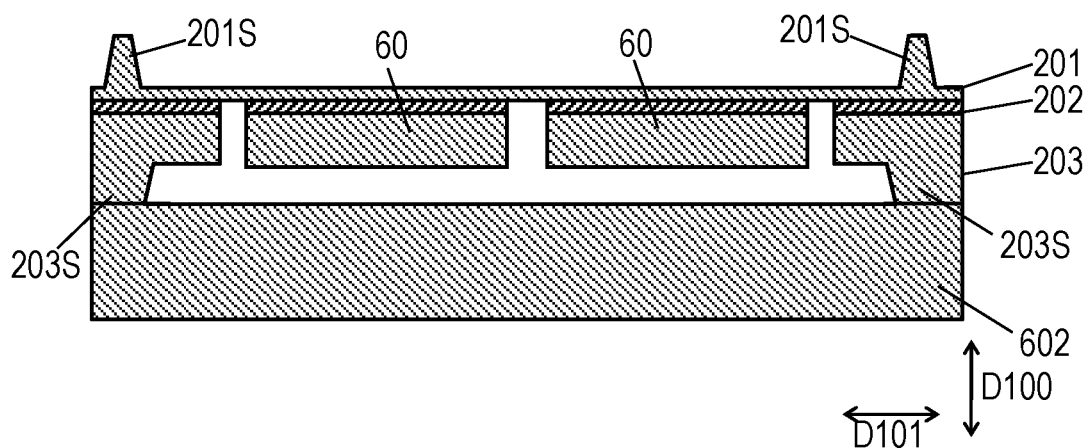
FIG. 16E is a cross-sectional view of the sensor shown in FIGS. 15A and 15B for illustrating the method of manufacturing the sensor.

After that, as shown in FIG. 16E, lower lid substrate 602 made of silicon is directly joined by Si—Si room-temperature direct bonding to the lower surface of projection 203S that is disposed on the lower surface of support layer 203 of sensor substrate 1.

Figure 16F:
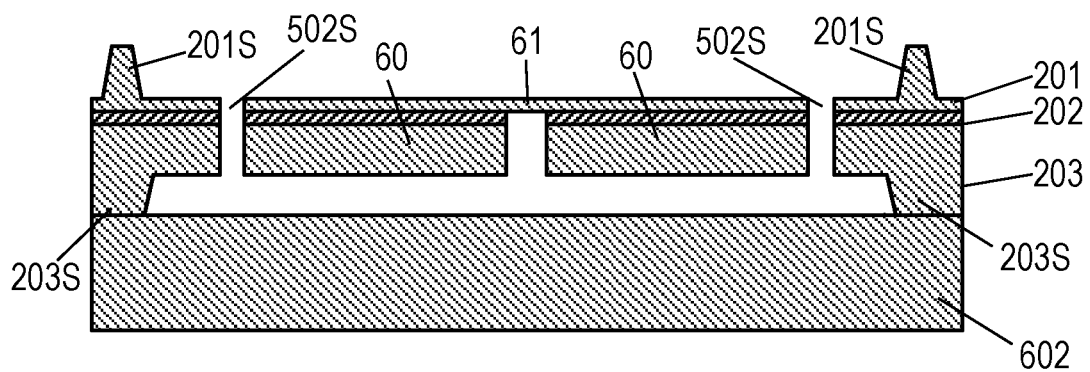
FIG. 16F is a cross-sectional view of the sensor shown in FIGS. 15A and 15B for illustrating the method of manufacturing the sensor.

Then, as shown in FIG. 16F, a resist pattern is formed on the upper surface of active layer 201 by, e.g. photolithography. Then, active layer 201 is etched from the upper surface of the active layer through the resist pattern, thereby forming slits 502S which separate weights 60 from fixed part 50 shown in FIG. 15A.

After that, sensor substrate 1 and lower lid substrate 602 which are to be joined to each other are cleaned. Then, projection 601S of upper lid substrate 601 is directly joined to projection 201S of active layer 201 by Si—Si room-temperature direct bonding, thereby providing sensor 502 shown in FIGS. 15A and 15B.

In the above embodiments, terms, such as "upper surface," "lower surface," "upper lid substrate," "lower lid substrate," and "viewing from above" indicating directions indicate relative directions depending only on the relative positional relationship of the constituent components of the sensors, and do not indicate absolute directions, such as a vertical direction.

REFERENCE MARKS IN THE DRAWINGS 1 sensor substrate
10 movable part
10A to 10D weight
11A, 11B weight
20 to 27 electrode 30 to 33 electrode
40 to 47 electrode
50 fixed part
60 beam
61 weight
70, 80, 90 sensor device
201 active layer
202 sacrificial layer
203 support layer
601 upper lid substrate
602 lower lid substrate
603 electrode
604 wire
605 via-electrode

The invention claimed is:

1. A sensor comprising:
a sensor substrate including a fixed part, a beam connected to the fixed part, and a weight connected to the beam, the weight being movable relative to the fixed part; and
an upper lid substrate joined to an upper surface of the sensor substrate,
wherein the upper lid substrate includes:
a first part containing silicon; and
a second part joined to the first part, the second part containing glass, and
wherein the first part includes a projection protruding toward the sensor substrate relative to the second part, and
wherein the first part and the second part of the upper lid substrate are arranged in a direction parallel to the upper surface of the sensor substrate.

2. The sensor according to claim 1, wherein the projection is directly joined to the upper surface of the sensor substrate.

3. The sensor according to claim 1,
wherein the fixed part of the sensor substrate has an upper surface, and
wherein the projection is directly joined to the upper surface of the fixed part.

4. The sensor according to claim 1,
wherein the first part of the upper lid substrate has an electrical conductive property, and
wherein the second part of the upper lid substrate has an electrical insulation property.

5. The sensor according to claim 1,
wherein the upper lid substrate includes a plurality of first parts including the first part, the plurality of first parts containing silicon and joined to the second part,
wherein the plurality of the first parts include a plurality of the projections, respectively, the plurality of the projections including the projection and protruding toward the sensor substrate relative to the second part, and
wherein a width of an outermost projection out of the plurality of projections which is closest to an outer edge of the upper lid substrate among the plurality of projections is larger than a width of any other projection out of the plurality of projections.

6. The sensor according to claim 1, wherein the sensor substrate is made of a silicon-on-insulator (SOI) substrate.

7. The sensor according to claim 1, wherein the second part of the upper lid substrate faces the weight.

8. The sensor according to claim 1,
wherein the upper lid substrate has an lower surface facing the upper surface of the sensor substrate, and has an upper surface opposite to the lower surface of the upper lid substrate, and
wherein the first part passes through the upper lid substrate from the lower surface of the upper lid substrate to the upper surface of the upper lid substrate.

9. A sensor comprising:
a sensor substrate including a support layer, a sacrificial layer disposed on an upper surface of the support layer, and an active layer disposed on an upper surface of the sacrificial layer;
an upper lid substrate joined to an upper surface of the sensor substrate; and
a lower lid substrate joined to a lower surface of the sensor substrate,
wherein the active layer includes:
a fixed part fixed to the support layer via the sacrificial layer;
a beam connected to the fixed part, the beam being deformable; and
a weight connected to the beam, the weight being movable relative to the fixed part, and
wherein a plurality of through-holes are provided in the support layer at a position facing one of the weight and the beam, the through hole penetrating the support layer from an upper surface of the support layer to a lower surface of the support layer, and
wherein the support layer has a mesh structure configured with the plurality of through-holes.

10. The sensor according to claim 9, wherein a thickness of the upper lid substrate is equal to a thickness of the lower lid substrate.

11. The sensor according to claim 10, wherein the upper lid substrate and the lower lid substrate hermetically seal the sensor substrate.

12. The sensor according to claim 11, wherein the upper lid substrate and the lower lid substrate seal the sensor substrate in vacuum.

13. The sensor according to claim 9, wherein the plurality of through-holes flare toward the one of the weight and the beam.

14. The sensor according to claim 9, wherein the plurality of through-holes taper toward the one of the weight and the beam.

15. The sensor according to claim 9, wherein the plurality of through-holes include constriction portions having a locally-reduced diameter.

16. The sensor according to claim 9, wherein the plurality of through-holes have rectangular shapes or circular shapes when viewed from above the sensor.

* * * * *